(12) United States Patent
Goh et al.

(10) Patent No.: US 12,228,610 B2
(45) Date of Patent: Feb. 18, 2025

(54) ILLUMINATOR METHOD AND DEVICE FOR SEMICONDUCTOR PACKAGE TESTING

(71) Applicant: UTAC Headquarters Pte. Ltd., Singapore (SG)

(72) Inventors: Boon Chew Goh, Nusajaya (MY); Jeffery Yap Chee Howe, Singapore (SG); Fatt Chye Low, Singapore (SG); Gilbert Eng Liang Goh, Singapore (SG); Seong Liang Lim, Singapore (SG); Kian Heng Ang, Singapore (SG); Zuping Chen, Singapore (SG)

(73) Assignee: UTAC Headquarters Pte. Ltd., Singapore (SG)

(*) Notice: Subject to any disclaimer, the term of this patent is extended or adjusted under 35 U.S.C. 154(b) by 138 days.

(21) Appl. No.: 17/805,274

(22) Filed: Jun. 3, 2022

(65) Prior Publication Data
US 2022/0390510 A1 Dec. 8, 2022

Related U.S. Application Data

(60) Provisional application No. 63/196,256, filed on Jun. 3, 2021.

(51) Int. Cl.
G01R 31/311 (2006.01)
G01J 3/02 (2006.01)
(Continued)

(52) U.S. Cl.
CPC .......... G01R 31/311 (2013.01); G01J 3/0237 (2013.01); G01J 3/027 (2013.01);
(Continued)

(58) Field of Classification Search
CPC .... G01J 3/02; G01J 3/10; G01J 3/0237; G01J 3/027; G01J 3/0275; G01J 3/108;
(Continued)

(56) References Cited

U.S. PATENT DOCUMENTS 5,685,637 A 11/1997 Chapman et al.

FOREIGN PATENT DOCUMENTS

| CN | 103080731 A | * | 5/2013 | ......... G01N 21/6489 |
| CN | 110231145 A | * | 9/2019 | ............ G01M 11/00 |

(Continued)

OTHER PUBLICATIONS

English translation CN110231145A (Year: 2019).*
(Continued)

Primary Examiner — Alesa Allgood
Assistant Examiner — Courtney G McDonnough
(74) Attorney, Agent, or Firm — Brian M. Kaufman; Robert D. Atkins; PATENT LAW GROUP: Atkins nd Associates, P.C.

(57) ABSTRACT

An illuminator system for semiconductor chip testing has a rotary plate and a first light source and second light source mounted on the rotary plate. A controller is configured to rotate the rotary plate to provide a desired light output. A light output of the illuminator system is aligned to the desired first or second light source. A first semiconductor chip receives illumination from the desired source. The rotary plate is rotated until the desired light source is aligned to the light output. A quality or characteristic of light emitted by the first light source can be measured, and then the first light source can be adjusted, or an alert can be generated, if the quality or characteristic falls outside of a preconfigured range.

12 Claims, 8 Drawing Sheets

(51) Int. Cl.
*G01J 3/10* (2006.01)
*G01R 31/265* (2006.01)
*G01R 31/28* (2006.01)

(52) U.S. Cl.
CPC ............ *G01J 3/0275* (2013.01); *G01J 3/108* (2013.01); *G01R 31/2656* (2013.01); *G01R 31/2894* (2013.01); *G01R 31/2896* (2013.01); *G01J 2003/106* (2013.01)

(58) Field of Classification Search
CPC ............... G01J 2003/106; G01J 1/4257; G01J 2001/4247; G01R 31/28; G01R 31/311; G01R 31/2656; G01R 31/2894; G01R 31/2896; G01R 31/2644; G01R 31/44; G01R 1/0408; G01R 31/275
USPC .................................................... 324/762.01
See application file for complete search history.

(56) References Cited

FOREIGN PATENT DOCUMENTS

| | | | | | |
|---|---|---|---|---|---|
| EP | 3431918 | A1 | * | 1/2019 | ......... G01B 11/0608 |
| JP | 2001091222 | A | * | 4/2001 | ............ G01B 11/06 |
| TW | 201317564 | A | * | 5/2013 | ............. G01N 21/88 |
| WO | WO-2010141269 | A2 | * | 12/2010 | ......... H05B 33/0848 |

OTHER PUBLICATIONS

English translation TW201317564A (Year: 2013).*
English translation JP 2001091222A (Year: 2017).*
English translation EP 3431918A1 (Year: 2019).*
Search English Translation CN 103080731 A (Year: 2013).*

* cited by examiner

ILLUMINATOR METHOD AND DEVICE FOR SEMICONDUCTOR PACKAGE TESTING

CLAIM OF DOMESTIC PRIORITY

The present application claims the benefit of U.S. Provisional Application No. 63/196,256, filed Jun. 3, 2021, which application is incorporated herein by reference.

FIELD OF THE INVENTION

The present invention relates in general to semiconductor devices and, more particularly, to an illuminator method and device for semiconductor package testing.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Testing of completed semiconductor packages is an important part of the manufacturing process. Testing keeps faulty packages from being included in end products, which are then discovered to be faulty after wasting time and resources that could have been saved by testing the semiconductor package in advance.

Testing of optically sensitive semiconductor packages includes illuminating a completed package for testing and then observing how the package behaves. One issue with optical testing is that the software algorithms and inspection hardware used are typically calibrated for a specific wavelength or mix of light and also for specific luminescence levels. However, light sources used in semiconductor package testing illuminators tend to fail over time, which failure may not be immediately noticed. Light sources for testing that fail to reach the desired illuminance level, or fail to produce the expected color temperature, will result in false positives or false negatives when testing semiconductor packages. Therefore, a need exists for an improved illuminator method and device for semiconductor package testing.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
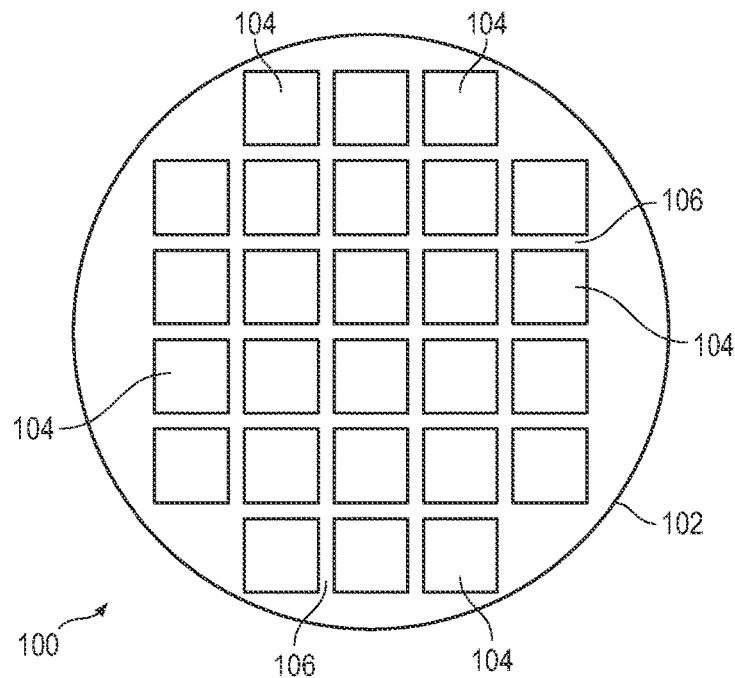
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
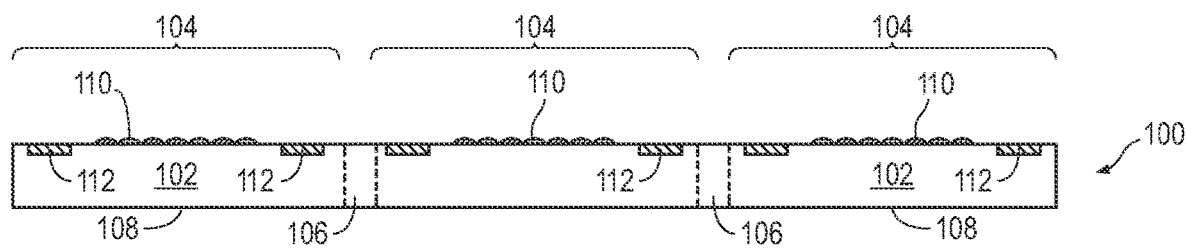

FIG. 1B shows a cross-sectional view of a portion of semiconductor wafer 100. Each semiconductor die 104 has a back or non-active surface 108 and an active surface including a photosensitive circuit 110 and additional analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements to implement analog circuits or digital circuits, such as digital signal processor (DSP), application specific integrated circuits (ASIC), memory, or other signal processing circuit. Semiconductor die 104 may also contain integrated passive devices (IPDs), such as inductors, capacitors, and resistors, for RF signal processing. Semiconductor die 104 can be implemented in a digital camera, luminescence sensor, or any other photosensitive device.

An electrically conductive layer 112 is formed over the active surface using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), platinum (Pt), or other suitable electrically conductive material. Conductive layer 112 operates as contact pads electrically connected to the circuits on the active surface.

Figure 1C:
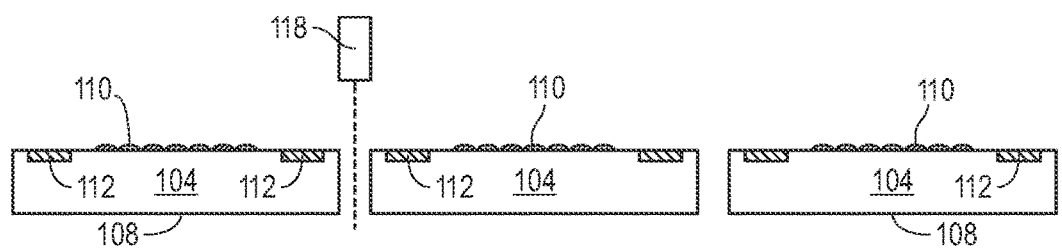

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2:
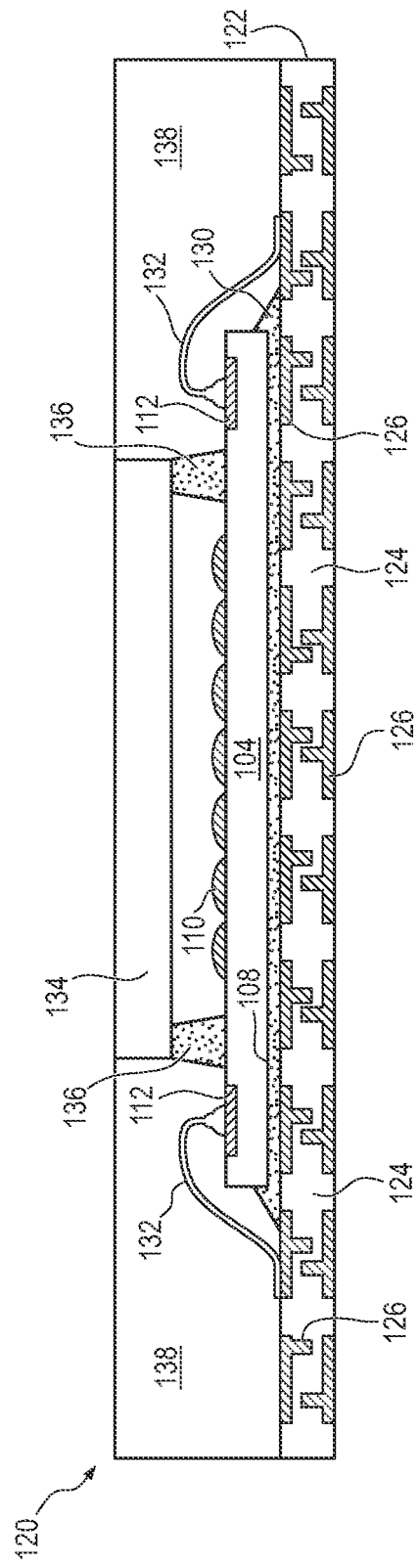
FIG. 2 illustrates an exemplary optically sensitive semiconductor package.

FIG. 2 shows an exemplary semiconductor package 120 with optically sensitive semiconductor die 104. Substrate 122 includes one or more insulating layers 124 interleaved with one or more conductive layers 126. Insulating layer 124 is a core insulating board in one embodiment, with conductive layers 126 patterned over the top and bottom surfaces, e.g., a copper-clad laminate substrate. Conductive layers 126 also include conductive vias electrically coupled through insulating layers 124. Substrate 122 can include any number of conductive and insulating layers interleaved over each other. A solder mask or passivation layer can be formed over either side of substrate 122. Any suitable type of substrate or leadframe is used for substrate 122 in other embodiments.

Substrate 122 has semiconductor die 104 mounted thereon, as well as any discrete active or passive components, other semiconductor die, or other components desired for the intended functionality of semiconductor package 120. Any type and number of components can be mounted on both the top and bottom surfaces of substrate 122, or embedded within the substrate.

Semiconductor die 104 is disposed on substrate 122 using a pick-and-place process, or another suitable process or device, with photosensitive circuit 110 and contact pads 112 oriented away from the substrate. A mold underfill or other adhesive 130 is disposed on back surface 108 or substrate 122 prior to mounting semiconductor die 104. Adhesive 130 keeps semiconductor die 104 in place during the manufacturing process.

A plurality of bond wires 132 is formed between contact pads 112 of semiconductor die 104 and contact pads of substrate 122. Bond wires 132 are mechanically and electrically coupled to conductive layer 126 of substrate 122 and to contact pads 112 of semiconductor die 104 by thermocompression bonding, ultrasonic bonding, wedge bonding, stitch bonding, ball bonding, or another suitable bonding technique. Bond wires 132 include a conductive material such as Cu, Al, Au, Ag, a metal alloy, or a combination thereof. Bond wires 132 represent one type of interconnect structure that electrically couples semiconductor die 104 to substrate 122. In other embodiments, solder bumps, conductive pillars, or another suitable interconnect structure is used. Semiconductor die 104 is a flip-chip die with photosensitive circuit 110 formed on the opposite surface from contact pads 112 in one embodiment.

A cover, lid, or lens 134 is disposed on semiconductor die 104 over photosensitive circuit 110. Lens 134 can alternatively be mounted prior to forming bond wires 132. Lens 134 has light-transmissive properties to allow an optical signal from outside of package 120 to be detected by photosensitive circuit 110. Lens 134 is formed from glass or a light-transmissive polymer in some embodiments. Lens 134 can have any combination of convex, concave, curved, domed, Fresnel, or other shaped surfaces to guide or focus light as desired. Lens 134 may also be flat as illustrated and operate primarily to physically protect photosensitive circuit 110 without significantly modifying light transmitted through the lens. Lens 134 can be totally transparent or have a material that filters one or more wavelengths of light.

Lens 134 is mounted to semiconductor die 104 over photosensitive circuit 110 using an adhesive 136. Adhesive 136 forms a continuous bead completely around the perimeter of lens 134 to protect a cavity between the lens and semiconductor die 104 when encapsulant is deposited. Adhesive 136 holds lens 134 in place over photosensitive circuit 110. Adhesive 136 is deposited onto lens 134 or semiconductor die 104 prior to disposing the lens onto the semiconductor die. In one embodiment, adhesive 136 is an ultraviolet (UV) cured adhesive and protective layer 164 is a material that allows UV light to pass, thereby allowing adhesive 136 to be cured by a UV light shining through the protective layer and lens 134. In another embodiment, adhesive 136 is a thermally cured adhesive with a curing temperature that is safe for protective layer 164 so that the adhesive can be cured without damaging the protective layer.

An encapsulant or molding compound 138 is deposited over substrate 122, semiconductor die 104, and lens 134, covering side surfaces of the lens and semiconductor die. Encapsulant 138 is an electrically insulating material deposited using a paste printing, compressive molding, transfer molding, liquid encapsulant molding, vacuum lamination, spin coating, or other suitable application process. Encapsulant 138 can be polymer composite material, such as an epoxy resin, epoxy acrylate, or polymer with or without a filler. Encapsulant 138 is non-conductive and environmentally protects the semiconductor device from external elements and contaminants.

Encapsulant 138 is deposited using film-assisted molding or another method that blocks encapsulant 138 from flowing over the top of lens 134. A top surface of encapsulant 138 is made coplanar to the top surface of lens 134, as illustrated, by the molding process. Adhesive 136 blocks encapsulant 138 from flowing between lens 134 and semiconductor die 104.

FIG. 2 illustrates one basic optical package type, but there are nearly limitless types of optical packages that can be manufactured. No matter the type of semiconductor package being manufactured, testing with an illuminator is common. The packages can be ball-grid array, bump chip carrier, multi-chip module, quad flat non-leaded, wafer-level chip-scale, system-in-package, or any other type of package with any desired functionality.

Figure 3A:
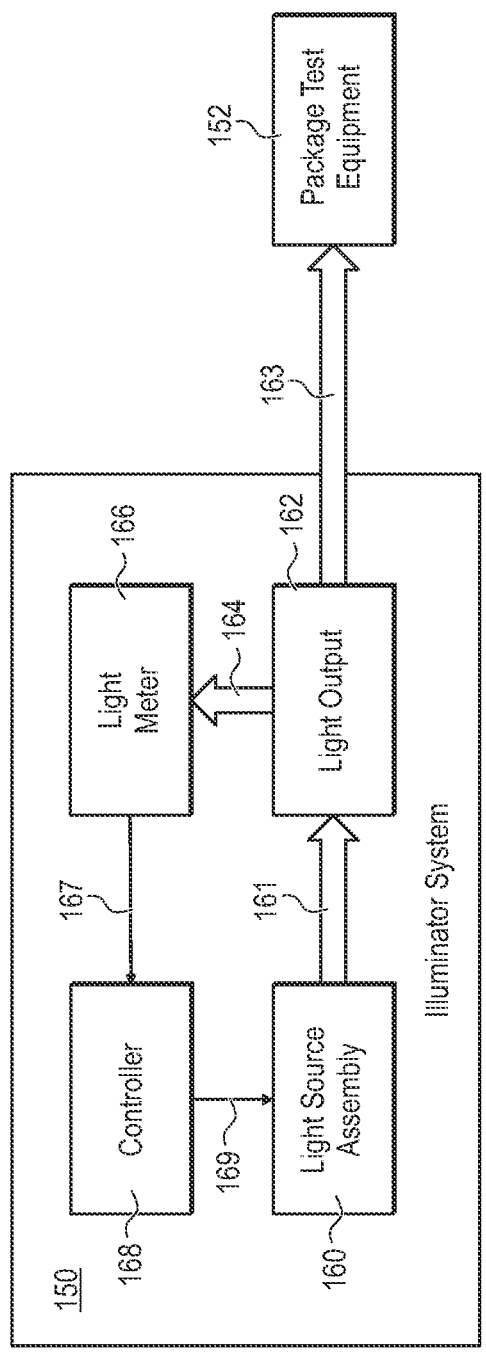
FIGS. 3a and 3b illustrate a method and device for automatically testing and adjusting a light source.

FIG. 3a shows a block diagram of illuminator system 150 used with package test equipment 152 for testing of light sensing chips in semiconductor packages. The tests include confirming proper operation of light sensing functions of semiconductor die 104 under different light conditions. Light received by semiconductor die 104 is converted to electrical signals for testing. The electrical signals are analyzed by package test equipment 152 to confirm proper operation of semiconductor die 104 within semiconductor package 120

A light source assembly 160 generates a light that is guided to light output 162 through a light conduit 161. Light conduit 161 can be a light tube, fiber optic cable, wave guide, or another suitable device. Light source assembly 160 can be as simple as a light bulb and a bracket to hold the light bulb in place. In other embodiments, more advanced assemblies are used, e.g., allowing multiple different light sources to be switched between as illustrated below. A halogen light source is most common, but light source assembly 160 can include a light-emitting diode, xeon light, infra-red light, ultra-violet light, other suitable light sources, or various combinations thereof.

Light output 162 receives the light signal from light source 160 and guides the light to one or more outputs of illuminator system 150 through light conduit 163. Light conduit 163 generally includes one or more flexible fiber optic cables so that the physical position of package test equipment 152 relative to illuminator system 150 can be variable. While a single conduit is shown going to a single package test equipment instance, light output 162 may split the light into a plurality of outputs in other embodiments.

Packages under test, e.g., packages 120, are disposed within package test equipment 152. The packages receive light from light output 162. Semiconductor die 104 generate electrical signals to test equipment 152 in response to the optical signal. Test equipment 152 analyses the electrical signals to determine the light sensitive performance of semiconductor package 120 with semiconductor die 104.

Light output 162 also splits off a portion of the light from light source assembly 160 to a secondary conduit 164 to light meter 166. Secondary conduit 164 is any suitable light guiding device, such as a fiber optic cable in a light tube. Light meter 166 is capable of measuring both luminescence level as well as color temperature of the light generated by light source assembly 160. In one embodiment, two light meters 166 are provided with one light meter measuring color temperature and one light meter measuring luminescence via two secondary light conduits 164. In other embodiments, other qualities or characteristics of the light are also measured by light meter 166. The term luminescence is used generally, but units can be in lumens, lux, candela per square meter, or any other unit that indicates the level or brightness of light being emitted. Color temperature is measured in Kelvin or mireds, but other suitable units can be used.

Light meter 166 measures color temperature and luminescence and then transmits the detected levels to controller 168 via an electrical conduit 167. Electrical conduit 167 is one or more wires or conductive traces on a printed circuit board (PCB). Light meter 166 communicates with controller 168 via I2C, UART, pulse-width modulation (PWM), ethernet, universal serial bus (USB), or another suitable protocol.

Controller 168 is made aware of the color temperature and luminescence level of light emitted by light source assembly 160 via light meter 166. Controller 168 compares the values received from light meter 166 with expected values based on the nominal values of light source assembly 160 being previously configured or programmed into the controller.

Controller 168 controls light source assembly 160 through electrical conduits 169, e.g., electrical wires or conductive traces on a PCB. Again, any suitable data format and protocol can be used, such as those mentioned above for communication between light meter 166 and controller 168. Other light-specific protocols can be used, such as 0-10V dimming or digital addressable lighting interface (DALI). In one embodiment, controller 168 is implemented on a PCB that has driver circuitry to directly drive a light source. The driver circuitry allows controller 168 to directly modify voltage or current to a light source to modify output luminance. Controller 168 can adjust the brightness or output level of light source assembly 160 to bring luminescence within an acceptable range or to reach a desired value. Some light sources of light source assembly 160 also have adjustment mechanisms for color temperature or other light qualities that controller 168 can automatically keep within acceptable parameters.

In other embodiments, one or more of luminescence, color temperature, or other qualities of light source assembly 160 are not adjustable. In those embodiments, controller 168 simply throws an error, such as by turning on an error light visible on the outside of illuminator system 150 or by generating a notification on another computer system. A user can switch out a bulb or other component in light source assembly 160, or otherwise manually adjust the light source assembly, to resolve the error. In one embodiment, a light source's luminance can be modified by controller 168 to return luminance to the desired value, but the controller has no ability to modify color temperature so a failure in color temperature only generates an error signal to the user.

Controller 168 includes a central processing unit, microcontroller, or other computer programmed to continually monitor light meter 166 and adjust light source assembly 160 in a loop. In other embodiments, controller 168 only adjusts light source assembly 160 once when operation begins, periodically during use, or both. A user of illuminator system 150 can be assured that the light source being used for package test equipment 152 is operating within expected parameters. The number of incorrectly identified good or bad packages is reduced. Light meter 166 and controller 168 provide a calibration system for illuminator system 150 so that the light output is properly calibrated.

Figure 3B:
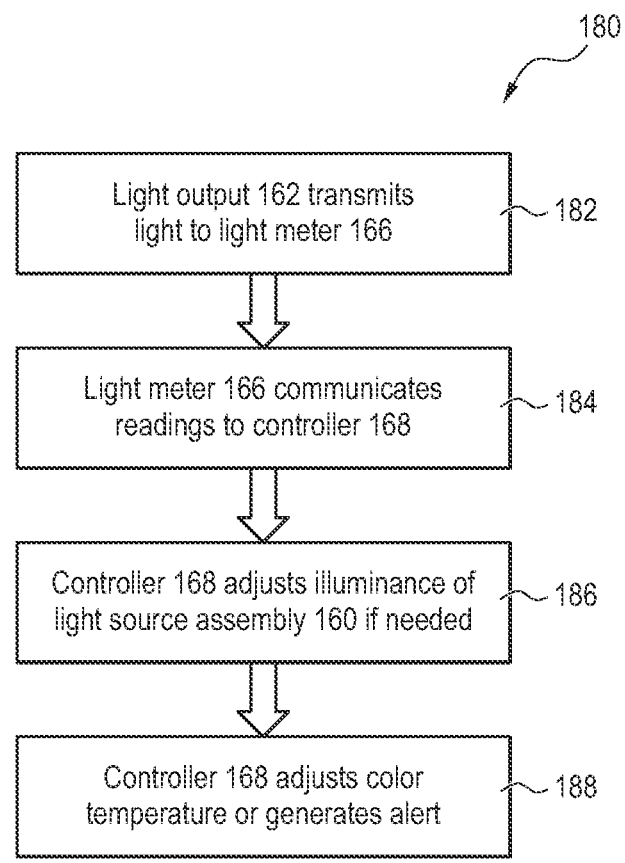

FIG. 3b shows calibration process 180 as explicit process steps in one embodiment. In step 182, light output 162 transmits light to light meter 166 via light conduit 164. Two conduits may transmit light to two or more different light meters to measure different qualities of the light, e.g., one for lux and one for color temperature. In step 184, light meter 166 signals read values to controller 168. In step 186, controller 168 compares the lux readings against expected values and adjusts a brightness of light source assembly 160 if outside the preconfigured expected values. In step 188, controller 168 compares the color temperature reading against expected values and either adjusts the color temperature output of light source assembly 160 if possible or otherwise generates an alert to indicate a failing light source.

Figure 4B:
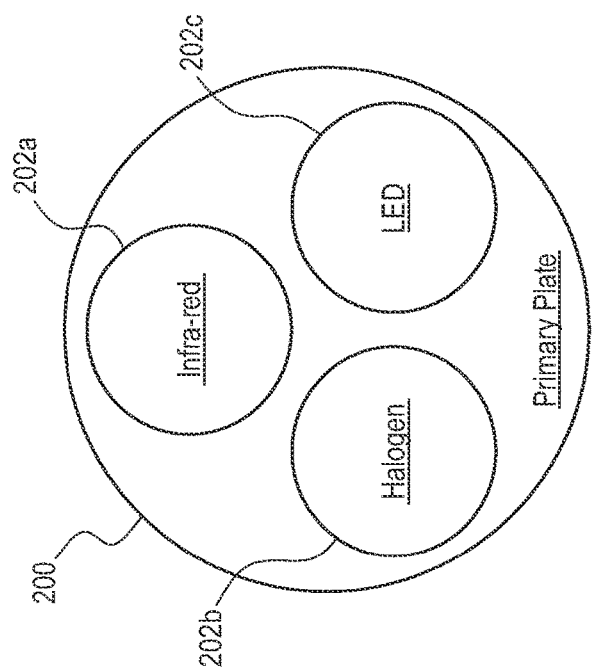
FIGS. 4a-4c illustrate a light source assembly with multiple selectable light sources.
Figure 4A:
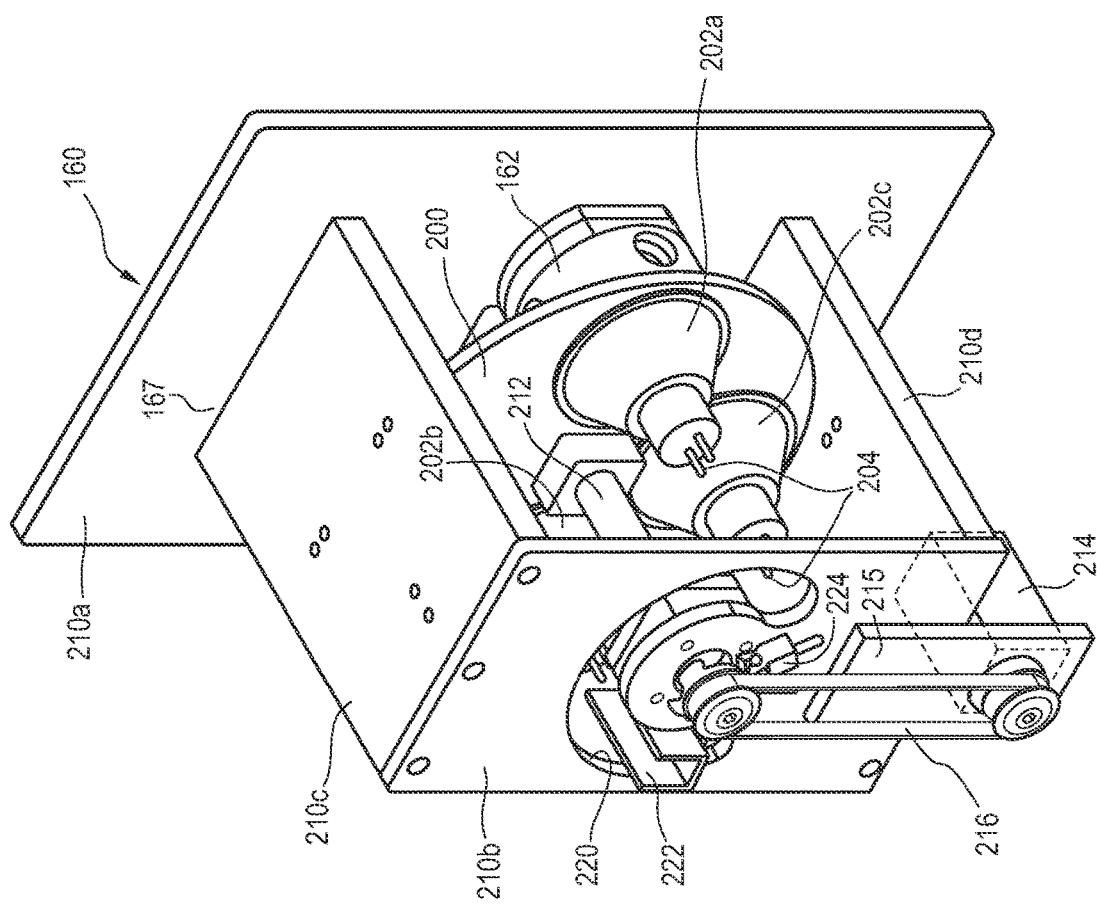
Figure 4C:
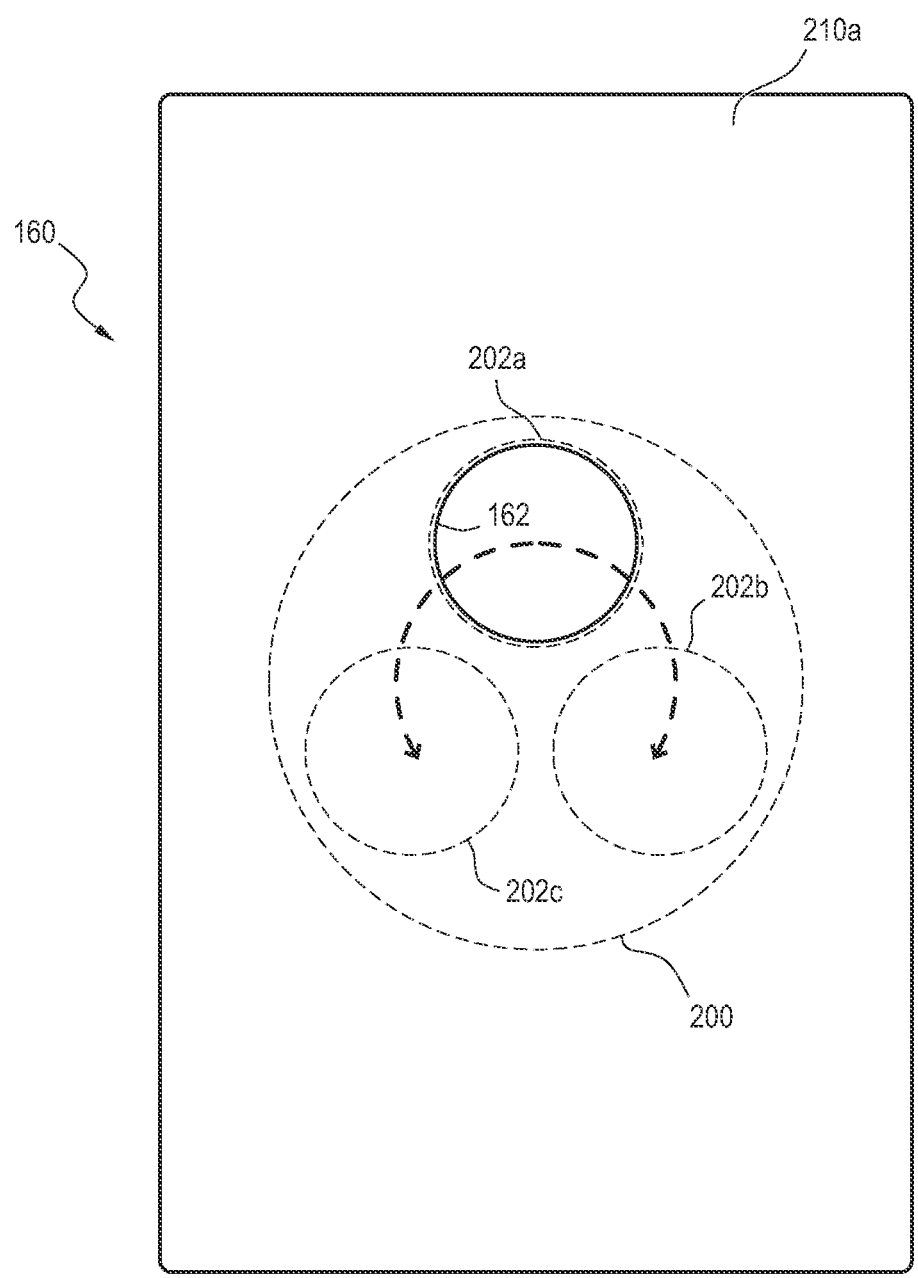

FIGS. 4a-4c illustrate details of light source assembly 160 in one embodiment. Light source assembly 160 includes a primary plate 200 with three different usable light sources 202a-202c. FIG. 4b shows plate 200 in plan view. In one embodiment, light source 202a is an infrared lamp, light source 202b is a halogen lamp, and light source 202c is a light emitting diode (LED) lamp. Plate 200 is rotatable within light source assembly 160 to select between light sources 202a-202c generating the light for output by illuminator system 150. In other embodiments, a rotary system for light source assembly 160 has two light sources or more than three light sources. Each light source 202a-202c includes one or more electrical terminals 204 that allow a connection to controller 168 for the controller to power the light source and modify brightness, luminance, color temperature, other light qualities, or a subset thereof for each light source.

Plate 200 is mounted within a frame 210 consisting of alignment plate 210a, back plate 210b, top plate 210c, and bottom plate 210d attached to each other in a rectangle. Primary plate 200 is mounted onto an axle 212 that is rotatably attached between alignment plate 210a and back plate 210b. Axle 212 can be rotated by stepper motor 214 using a belt 216, gears, or another type of linkage to mechanically connect the stepper motor's output shaft to the axle. Axle 214 includes bearings or bushings to reduce friction during rotation in some embodiments. Stepper motor 214 is mounted to back plate 210b via a bracket 215 or directly to the back plate or bottom plate 210d.

Stepper motor 214 receives commands from controller 168 via any suitable stepper motor control protocol. Pulse-width modulation is used in one embodiment. A user of illuminator system 150 will typically direct that a certain type of light source be used, either via a control input or by programming or configuring the illuminator system to operate in a certain mode. Controller 168 responds to the user configuration or programming by rotating plate 200, via stepper motor 214, belt 216, and axle 212 until the desired light source 202a-202c is aligned to light output 162. Alignment plate 210a has a through-hole aligned to light output 162 to allow light through the alignment plate. FIG. 4b shows a plan view of light source assembly 160 from the front illustrating how plate 200 rotates with light source 202a aligned to light output 162.

A semicircular opening 220 is formed in back plate 210b to accommodate an arm 222 extending from axle 212. A limit switch 224 at one end of opening 220 is electrically coupled to controller 168. When plate 200 is rotated to its maximum limit toward limit switch 224, arm 222 closes the limit switch and thereby notifies controller 168 of the position of arm 222, axle 212, and plate 200, which are all three in fixed positions relative to each other. Arm 222 pressing limit switch 224 is considered the zero point of axle 212 rotation. Controller 168 includes configuration for how far plate 200 must be rotated from the zero point to have each light source 202a-202c aligned with light output 162. To effect a light source selection, controller 168 rotates axle 212 until limit switch 224 is pressed, and then rotates in the opposite direction to align the commanded light source 202a-202c with light output 162. In some cases, axle 212 is only rotated to limit switch 224 once after controller 168 boots and then the controller remembers the position of axle 212.

Figure 5A:
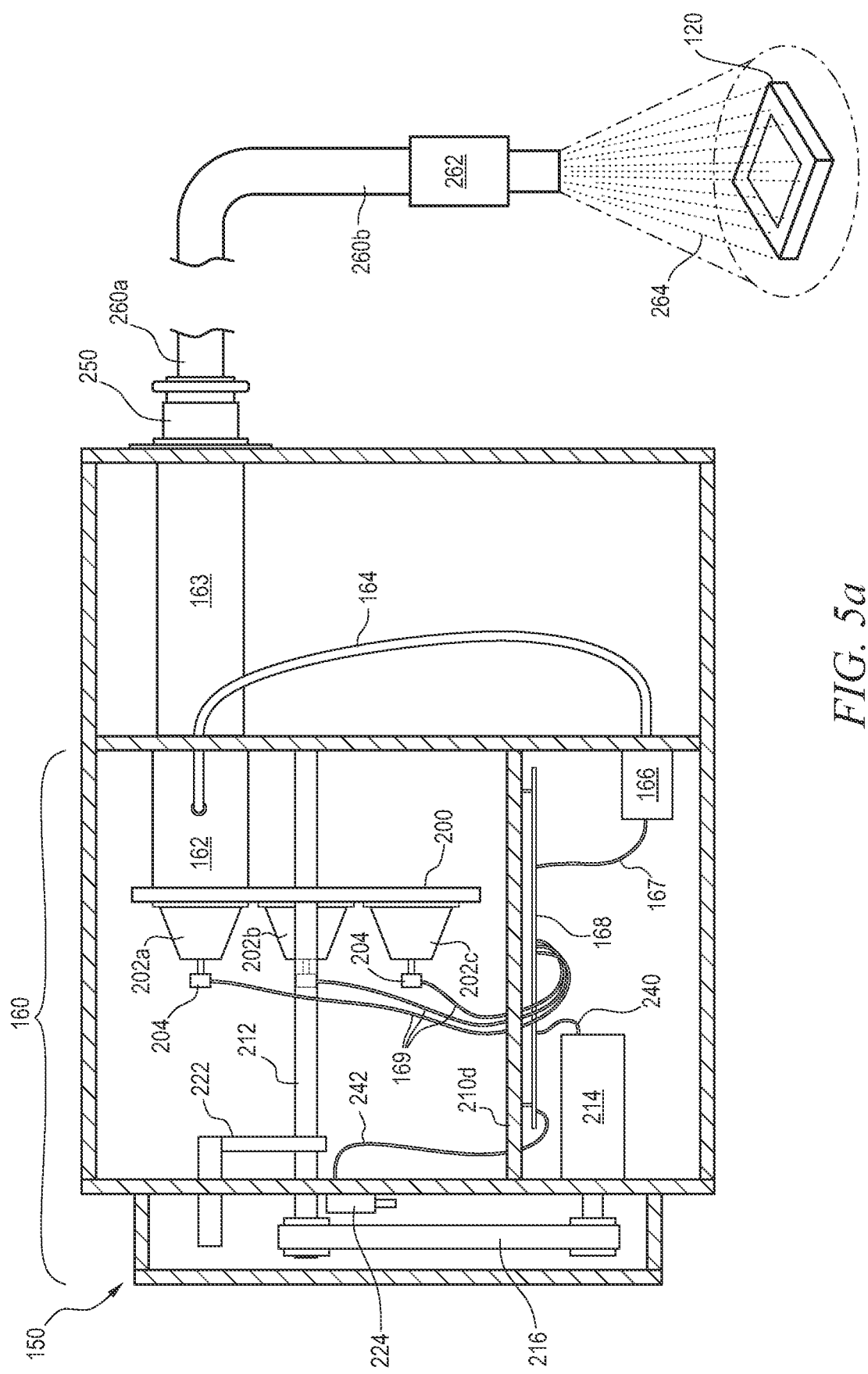
FIGS. 5a and 5b illustrate an illuminator system for semiconductor testing with the selectable light source.

FIG. 5a shows illuminator system 150 with light source assembly 160 in operation. Controller 168 is implemented as a PCB mounted under bottom plate 210d. Wires 240 connect stepper motor 214 to controller 168 and allow the controller to set a position of plate 200, thereby selecting between light sources 202a-202c for use in testing. Wires 242 connect limit switch 224 to controller 168 and allow the controller to determine a position of axle 212 via arm 222. Wires 167 connect light meter 166 to controller 168. The outputs of light sources 202a-202c are controlled by controller 168 via wires 169. The PCB of controller 168 will generally have driver circuitry for light sources 202a-202c, e.g., power amplifiers or a switch-mode power supply to generate the necessary voltage to power each light source. The wires can be connected to terminal blocks on controller 168 or directly soldered to the controller PCB.

Light conduit 164 routes a portion of the light emitted by a light source 202 to light meter 166. Controller 168 communicates with light meter 166 via wires 167 to determine a quality of the light emitted, and then can adjust the light via wires 169. Controller 168 is separately configured with the expected luminance, color temperature, frequency, and any other measured qualities of each light source 202a-202c so that whichever light source is active can be calibrated properly or changed out if defective.

Light conduit 163 has a connector 250 that allows one or more fiber optic cables 260 to be connected. Fiber optic cable 260 guides light to package test equipment 152 as part of conduit 163. Fiber optic cable 260 in FIG. 5a has a first end 260a coupled to connector 250. A second end 260b has an emitter 262 that spreads out light over a desired area at a desired angle. The area and angle of light can be adjusted by package test equipment 152 in some embodiments, or manually by turning a portion of emitter 262. Size adjustment can be used to cater to semiconductor packages of different sizes.

Light beam 264 from emitter 262 covers a semiconductor package 120 that is under test. Cameras and other sensors in package test equipment 152 observes package 120 under beam 264 to confirm that manufacturing of the semiconductor package occurred successfully.

Figure 5B:
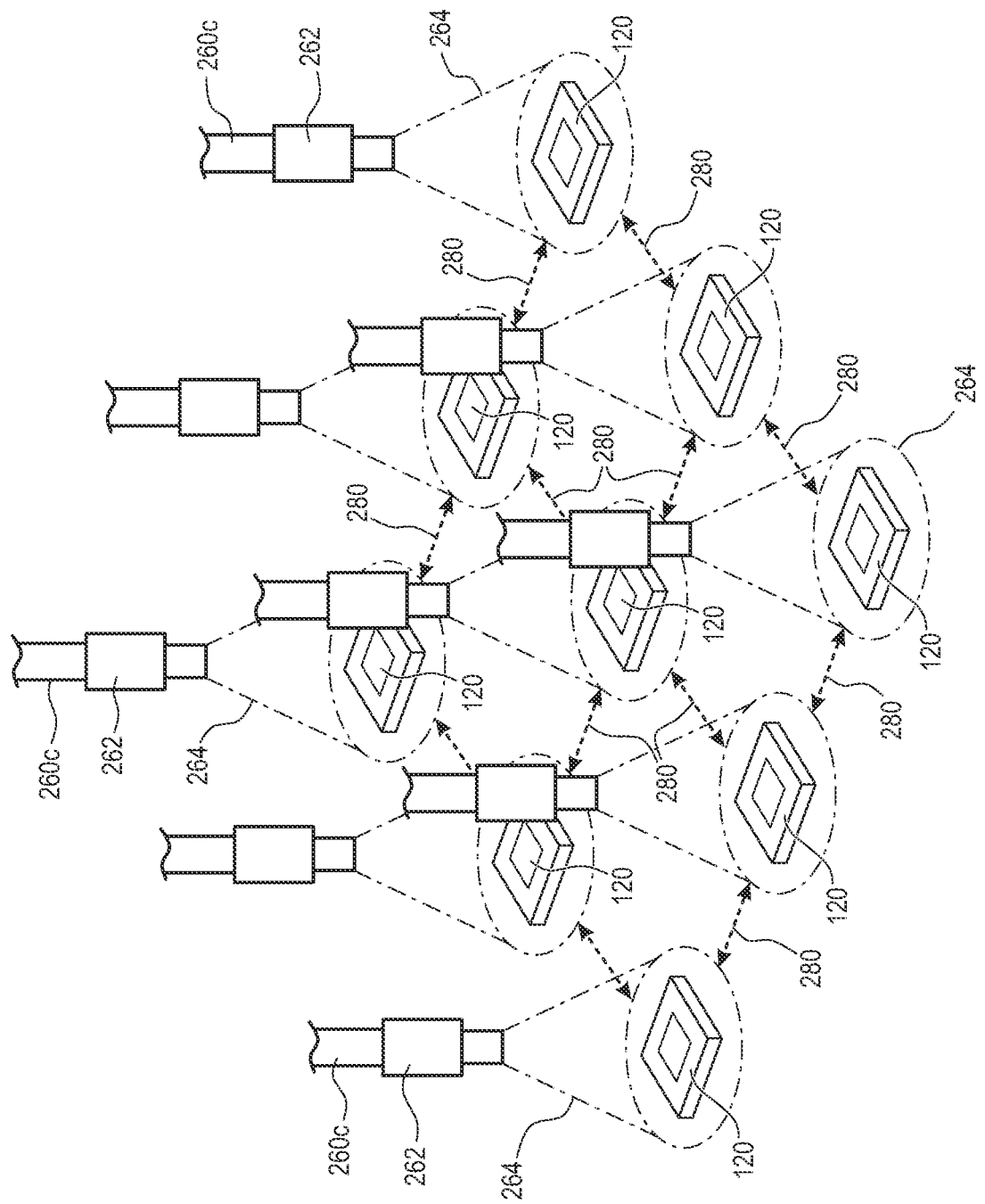

Fiber optic cable 260 in FIG. 5b is split into a plurality of secondary optical cables 260c to emit light onto multiple semiconductor packages 120 at once. Illuminator system 150 is configurable for semiconductor packages having different sizes. Semiconductor packages which have different sizes need different pitches for secondary light tubes. A holder for secondary optical cables 260c has a configurable pitch, illustrated by arrows 280, that allows different pitches between packages under test to be accommodated. This reduces the cost and availability lead time when being used in different equipment or for semiconductor packages having different sizes. The pitch of secondary optical cables 260c can be modified by controller 168 or by package testing equipment 152.

Using illuminator system 160 with package test equipment 152 improves the performance of the package test equipment. Multiple different wavelengths and types of light can be used by switching between light sources 202a-202c. Moreover, the outputs of light sources 202a-202c are kept within desired ranges by monitoring the outputs with light meter 166 and auto calibrating the light output. Light supplied to package test equipment 152 is more reliable and configurable. Time is saved by allowing the light source to be switched without having to manually replace a bulb or other light source within the illuminator.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of testing a semiconductor device, comprising:
   providing an illuminator system comprising,
      a rotary plate,
      a first light source mounted on the rotary plate,
      a second light source mounted on the rotary plate,
      a controller configured to rotate the rotary plate, and
      a light output aligned to the first light source;
   illuminating a first semiconductor package using the first light source, wherein a first photosensitive circuit of the first semiconductor package converts a first optical signal from the first light source into a first electrical signal;
   analyzing the first electrical signal to confirm proper operation of the first photosensitive circuit;
   rotating the rotary plate until the second light source is aligned to the light output after illuminating the first semiconductor package using the first light source; and
   illuminating a second semiconductor package using the second light source after rotating the rotary plate.

2. The method of claim 1, further including:
measuring a quality of a light emitted by the first light source using a light meter; and
adjusting the first light source using the controller after detecting the quality of the light falling outside of a preconfigured range.

3. The method of claim 1, further including:
measuring a quality of a light emitted by the first light source using a light meter; and
generating an alert after detecting the quality of the light falling outside of a preconfigured range.

4. The method of claim 1, wherein the first light source is a halogen light source and the second light source is a light-emitting diode (LED) light source.

5. The method of claim 4, further including an infra-red (IR) light source mounted on the rotary plate.

6. The method of claim 1, further including coupling a plurality of secondary optical cables to the illuminator system, wherein the plurality of secondary optical cables has a variable pitch.

7. A semiconductor testing device, comprising:
a rotary plate;
a first light source mounted on the rotary plate;
a second light source mounted on the rotary plate;
a controller configured to rotate the rotary plate;
a light output aligned to the first light source or second light source;
a first light conduit positioned to route an optical signal from the light output; and
a light meter configured to receive the optical signal from the first light conduit and measure a quality of the optical signal, wherein the controller is configured to communicate with the light meter and adjust the first light source or second light source based on the quality of the optical signal.

8. The semiconductor testing device of claim 7, wherein the first light source includes a halogen light source and the second light source includes a light-emitting diode (LED) light source.

9. The semiconductor testing device of claim 8, further including an infra-red light source mounted on the rotary plate.

10. The semiconductor testing device of claim 7, further including a plurality of secondary optical cables coupled to the light output.

11. The semiconductor testing device of claim 10, wherein the plurality of secondary optical cables has a variable pitch.

12. The semiconductor testing device of claim 7, wherein the quality of the optical signal includes brightness or color temperature.

* * * * *